United States Patent [19]

Knapp et al.

[11] 4,414,547

[45] Nov. 8, 1983

[54] STORAGE LOGIC ARRAY HAVING TWO CONDUCTOR DATA COLUMN

[75] Inventors: William Knapp, Chandler; William Dunn, Scottsdale, both of Ariz.; Kent F. Smith, Salt Lake City, Utah

[73] Assignee: General Instrument Corporation, New York, N.Y.

[21] Appl. No.: 312,188

[22] Filed: Oct. 16, 1981

[30] Foreign Application Priority Data

Aug. 5, 1981 [GB] United Kingdom ............... 8123966

[51] Int. Cl.³ .................... H04Q 9/00; H03K 19/177
[52] U.S. Cl. .............................. 340/825.83; 307/465; 365/203; 340/825.87
[58] Field of Search ...................... 340/825.83, 825.86, 340/825.87; 307/465; 364/716; 365/203

[56] References Cited

U.S. PATENT DOCUMENTS

| | | | |
|---|---|---|---|
| 4,031,522 | 6/1977 | Reed et al. | 365/203 |
| 4,069,475 | 1/1978 | Boettcher | 365/203 |
| 4,081,701 | 3/1978 | White, Jr. et al. | 365/203 |
| 4,207,556 | 6/1980 | Sugiyama et al. | 340/825.87 |
| 4,293,783 | 10/1981 | Patil | 340/825.87 |
| 4,351,034 | 9/1982 | Eaton, Jr. et al. | 365/203 |

FOREIGN PATENT DOCUMENTS

| | | |
|---|---|---|
| 1260426 | 1/1972 | United Kingdom . |
| 1260777 | 1/1972 | United Kingdom . |
| 1347470 | 2/1974 | United Kingdom . |
| 1457423 | 12/1974 | United Kingdom . |
| 1535859 | 12/1978 | United Kingdom . |
| 1541969 | 3/1979 | United Kingdom . |

Primary Examiner—Donald J. Yusko
Attorney, Agent, or Firm—Barry R. Lipsitz

[57] ABSTRACT

A clocked storage logic array is formed from a plurality of columns and a plurality of rows disposed orthogonal to the columns. Logic cells interconnect selected columns and rows. At least one storage cell is operatively associated with at least one data column. The storage cell utilizes only two column conductors which are time shared to provide a data path from a memory element in the storage cell to a specified row or rows and back from the row(s) through the same column conductors to the memory. A plurality of phase-displaced clock periods are generated which operate in association with logic cells to cause selected rows to assume binary states determined by the binary state of interconnected columns, and vice-versa. The clock periods also cooperate with storage cells to enable the two column conductors to be time shared.

44 Claims, 9 Drawing Figures

STORAGE LOGIC ARRAY HAVING TWO CONDUCTOR DATA COLUMN

BACKGROUND OF THE INVENTION

The present invention relates to digital logic arrays, and more particularly, to storage logic arrays which can be implemented as integrated circuits.

Programmable logic arrays are one method by which manufacturers can provide complex electronic circuitry on semiconductor chips. Programmable logic arrays are one member of a broader class of devices known as "semicustom integrated circuits." A semicustom integrated circuit is a device which can easily be "personalized" to provide desired functions. Masterslices, uncommitted logic arrays, gate arrays and macrocell arrays are different types of semicustom integrated circuits.

A gate array typically consists of a plurality of cells which can be interconnected to form different electronic circuits, each circuit performing a specific function.

Macrocell arrays are formed from cells that are more sophisticated than those used in simple gate arrays. These "macrocells" contain electronic circuitry which are capable of performing complete predefined functions.

An uncommitted logic array ("ULA") contains transistors arranged in a repetitive pattern on a silicon chip. The actual interconnections between the transistors are not made initially. Instead, the unconnected transistors in a standard ULA are connected during a final processing step which will determine the actual circuit functions that the ULA will perform. The ULA transistors can be connected to form any logic function, at will. These logic functions can be further connected to form more complex By contrast, a programmable logic array ("PLA") is usually constructed in the form of two arrays. One array, known as an AND array, forms a predefined output when all of its input data is at a proper level. The other array is known as an OR array and combines information from selected AND arrays to form outputs. The PLA is programmed by connecting predetermined input lines to the AND arrays and interconnecting appropriate AND and OR arrays.

One drawback to PLAs is that the amount of useful circuitry in them is limited by the number of input and output pins which can be placed in a standard integrated circuit package. Since the inputs to the AND array originate outside the integrated circuit chip, pins must be provided on the integrated circuit package to connect signals external to the chip to the circuitry inside the chip. Similarly, pins must be provided on the integrated circuit package to connect the outputs from the integrated circuitry to other circuitry external to the chip. Physical size limitations of the integrated circuit package dictate the number of such input and output pins which can be provided.

In response to such pin limitations, a specialized form of PLA, known as a storage logic array ("SLA"), has been developed. In an SLA, "storage cells" having memory capacity are provided to temporarily store interim calculations. In this manner, data generated within the SLA for use in subsequent operations of the SLA can be retained therein. Input and output pins are not wasted in transmitting such data out of the chip and then back into it for subsequent reuse. The data is simply maintained within the chip until it is no longer needed.

In a storage logic array, a specific type of memory element known as a flip-flop is generally used. Flip-flops are electronic circuits which change their output state, e.g. from a high level to a low level, in response to a predetermined input signal. The output of a flip-flop, once set at a given level, will remain at that level until reset by another input signal. Thus, a flip-flop functions as a memory element because once its output is set to a given level, it remembers and maintains that level until it is reset at a later point in time.

The general design and operation of a storage logic array is disclosed in U.S. Pat. No. 4,068,214, issued to Suhas S. Patil on Jan. 10, 1978. A good explanation of SLAs can also be found in the article "A Programmable Logic Approach for VLSI", S. S. Patil and T. A. Welch, *IEEE Transactions on Computers*, Vol. C-28, No. 9, September 1979, pages 594 to 601.

The storage logic array basically comprises a plurality of orthogonally disposed column and row conductors having "cells" connected thereto. Two classes of cells are used in conjunction with SLAs. Storage cells are those which contain memory elements such as the flip-flops described above, and are physically placed within SLA columns. Logic cells are relatively simple electronic circuit building blocks which are used to interconnect rows and columns of the SLA.

By arranging logic cells to interconnect columns and rows in accordance with one or more predetermined logical functions, the SLA can produce predetermined output signals in response to a predetermined input signal or set of signals. One advantage of SLAs is that selected columns and rows of the array can be subdivided into multiple independent sections which each perform different tasks. For example, one section of the array can be used to build a functional electronic circuit known as a register. Another section can be built to function as control circuitry, and a third independent section can be used to build an electronic adder to add numbers together. Specific flip-flops internal to each of these independent functional sections are used to store data generated within the section.

It should now be appreciated that an SLA is constructed of columns, rows, logic cells which interconnect selected columns and rows, and storage cells within the columns.

Past SLA designs have incorporated a storage cell having a memory element that required four separate conductors to get data into and out of the flip-flop. In these prior art arrangements, separate conductors are used for each of the two flip-flop inputs (known as the reset ("R") and set ("S") inputs) and each of the two flip-flop outputs (known as the "Q" and "$\overline{Q}$" outputs). Data is transferred into the flip-flop by means of the S and R input conductors. Data is transferred from the flip-flop by means of the Q and $\overline{Q}$ output conductors.

SUMMARY OF THE INVENTION

The present invention relates to an SLA having a special storage cell, which enables the columns of the SLA to operate using only two data conductors. This design is possible because the flip-flop within the storage cell can use the two data conductors in a column to both transmit and receive data.

The present invention, by reducing the required number of conductors required in a column to transport data, enables more SLA circuitry to be squeezed into an integrated circuit chip of a given size. Placing more circuitry into an integrated circuit chip is known to those skilled in the art as increasing the "density" of the integrated circuit.

The density of SLA's using the present invention is improved because of the reduction in the number of column data conductors which are required. Past designs, using four data conductors in each column, had to provide space for these data conductors on the integrated circuit chip. By reducing the number of data conductors in each column in the array from four to two, each column of an SLA fabricated in accordance with the present invention takes up less space. Thus, more columns can be placed within the SLA, providing more circuitry in a given chip area.

In accordance with the present invention, an integrated circuit storage logic array is provided which has at least one data column with two data column conductors. A plurality of rows is disposed substantially orthogonal to the data column. Each row typically has a single row conductor. A storage cell is operatively associated with the data column and has a memory element and input/output means. A plurality of logic cells interconnect selected columns and rows. Clock means is provided for generating a plurality of phase-displaced clock signals.

The clock means operates in association with the storage cell input/output means to enable each of the two data column conductors to be time shared to provide for signal transfer between the memory element to and from the data column. Data is transferred from the memory element to the data column responsive to one of the plurality of phase-displaced clock signals, and data is transferred to the memory element from the data column responsive to another of the plurality of phase-displaced clock signals.

DETAILED DESCRIPTION OF THE INVENTION

The present invention provides a storage logic array that has only two data conductors in each column associated with a memory element. The ability to use a two conductor data column results, in part, from a novel storage cell design. Prior designs of storage logic arrays utilized storage cells which required up to four conductors for inputting and outputting data therefrom. In such prior designs, separate conductors were needed for each of the two input signals and each of the two output signals associated with a flip-flop within the cell.

Three different embodiments of SLAs which operate with a single pair of column data conductors are described herein. Each embodiment utilizes circuitry which, in conjunction with phase-displaced clock signals, time-shares each of the two data conductors so that each can be used either to transmit data outputted from the flip-flop to selected logic cells, or to transmit data from selected logic cells into the flip-flop. Thus, data can be moved bi-directionally through the two data conductors.

The two-conductor storage cell of one of the SLA embodiments disclosed herein is used with a six-phase clock. A different two-conductor storage cell using a four-phase clock is found in the other embodiments. Common to each of the three embodiments, however, is the concept of an SLA data column having only *two* data conductors.

Figure 1:
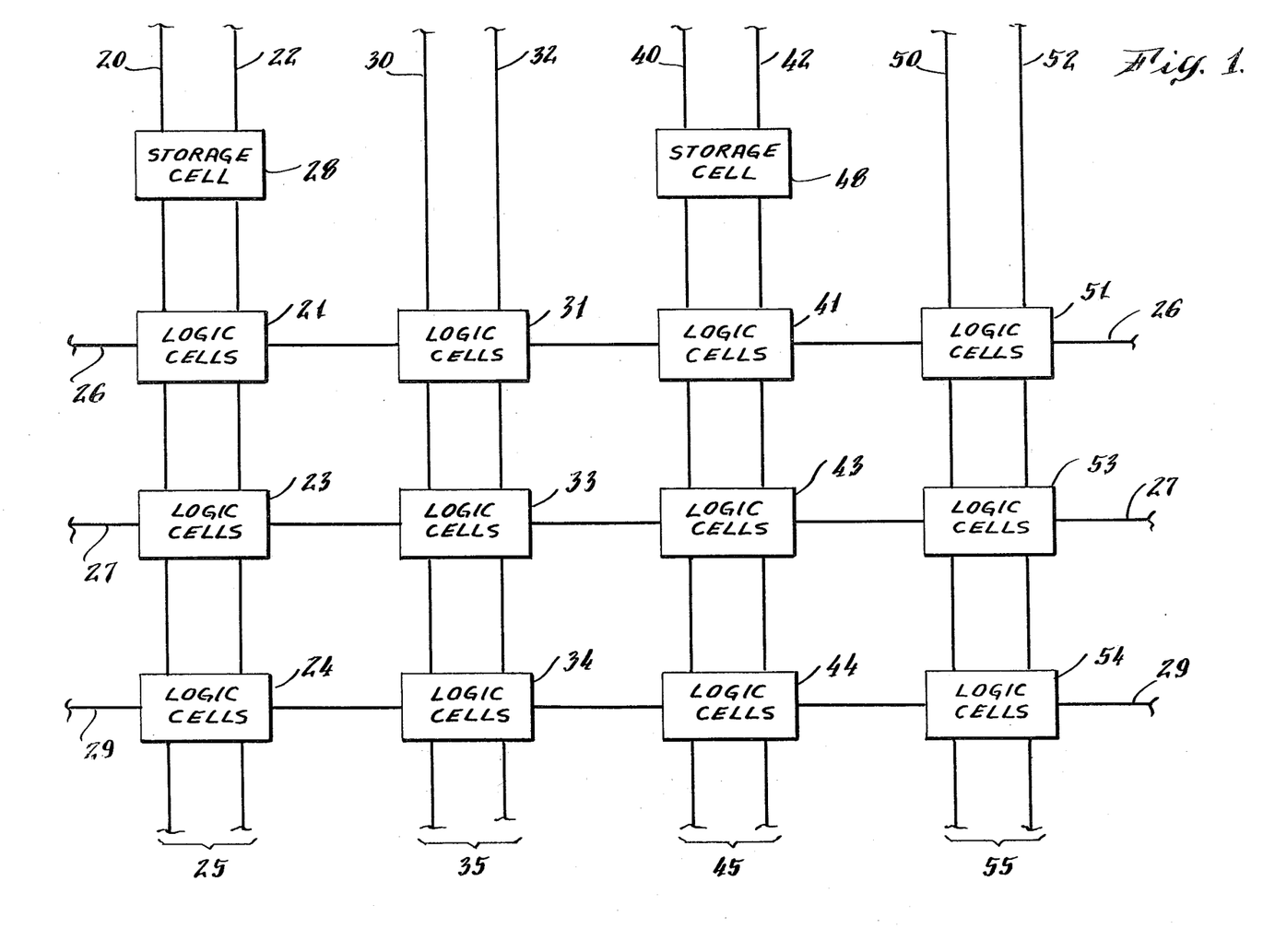
FIG. 1 is a block diagram of the storage logic array.

A storage logic array is illustrated in general in block diagram form in FIG. 1. The array includes a number of columns 25, 35, 45, and 55. In a complete array, more or fewer columns may be used, depending on the function(s) to be performed by the array. Within each column are two conductors. For example, column 25 includes conductors 20 and 22. Likewise, column 35 includes conductors 30, 32; column 45 conductors 40, 42; and column 55 conductors 50, 52.

Column 25 comprises storage cell 28 and a plurality of logic cells 21, 23 and 24. Storage cell 28 includes a memory element such as a flip-flop. As will be described in detail below, when the memory element of storage cell 28 is a flip-flop, conductor 20 of column 25 may be connected to the S (set) input and the $\overline{Q}$ output. Conductor 22 of column 25 may be connected to the R (reset) input and the Q output of the flip-flop. Signals on column conductors 20 and 22 of column 25 can be transferred to any combination of row conductors (e.g. 26, 27, 29 in FIG. 1) by logic cells 21, 23, and/or 24.

In designing a storage logic array to execute the steps of a predetermined logic function, a number of different logic cells are used. Among the available cells are those known as the "1" cell, the "S" cell, the "R" cell, the "OR" ("+") cell, the "1+" cell, and the "IO+" cell.

The operation of each of these cell types will now be described with reference to FIG. 1. As already indicated, storage cell 28 contains a memory element in the form of a flip-flop, in particular, an S/R flip-flop. For purposes of this explanation, it will be assumed that logic cell 21 is a "1" cell. The purpose of a "1" cell is to detect the state of a memory element, e.g. the flip-flop in storage cell 28, and to drive the row to which the "1" cell is connected to a binary level dependent upon the detected state of the flip-flop. Thus, if the "1" cell of block 21 is configured to detect the output of the flip-flop in storage cell 28 on column conductor 20, row conductor 26 to which the "1" cell is connected will be driven accordingly. In one embodiment, if the output of the flip-flop detected on column conductor 20 is high, the "1" cell will drive row 26 low. On the other hand, if the "1" cell detects the output of the flip-flop on column conductor 20 to be low, the "1" cell will be inhibited from altering the level of row 26.

The function of the "R" and "S" cells is to detect the state of a row and to reset or set the flip-flop in storage cell 28 accordingly. Logic cell 23 may contain an "S" cell. In this instance, the "S" cell will detect the binary state of row 27. In one embodiment, if the binary state of row 27 is high, the "S" cell will drive column conductor 20 low, thereby setting the flip-flop within storage cell 28. If the binary level of row 27 is low, the flip-flop will not be set by the "S" cell.

In the event logic cell 24 contains an "R" cell, this cell could be connected to detect the binary state of row 29 and to reset the flip-flop in storage cell 28 accordingly. If, for example, the binary state of row 29 were high, the "R" cell would cause column conductor 22 to go low and thereby reset the flip-flop in storage cell 28. The operation of the "OR" (or "+") cell, the "1+" cell, and the "IO+" cell will be described in conjunction with column 35 in FIG. 1. Logic cell 31, for example, could comprise an "+" cell. The purpose of the "+" cell is to detect the binary level of a corresponding row (for logic cell 31 the corresponding row is 26) and to drive a corresponding column conductor accordingly. If the "+" cell in block 31 of FIG. 1 is interconnected between column conductor 30 and row conductor 26, upon detecting a high signal on row 26, the cell will take column conductor 30 to a low logic level. If, on the other hand, the cell detects that the binary state of row 26 is low, it will have no effect upon column conductor 30.

Logic cell 33 of FIG. 1 may contain a "IO+" cell. This type of cell is used to detect the condition of a column conductor and drive a row conductor accordingly. Thus, if the "IO+" cell of block 33 in FIG. 1 detects a high binary level on column conductor 30, it will have no effect upon row conductor 27. If, however, the cell detects a low binary state on column conductor 30, it will drive the binary state of row conductor 27 to a low level.

A "1+" cell may be contained in block 34 of FIG. 1. This cell will detect the state of a column conductor, e.g. column conductor 30, and drive row 29 accordingly. If column conductor 30 is high, row 29 will be driven low. If column conductor 30 is low, the "1+" cell will have no effect upon row conductor 29.

It will be appreciated by those skilled in the art that other types of cells may be provided. It will also be appreciated by those skilled in the art, that by placing different cell types throughout the storage logic array, any desired logic function or combination of functions can be obtained. Thus, the storage logic array of the present invention can be designed, through the proper placement of logic cells, to provide any desired logic combination.

Figure 2:
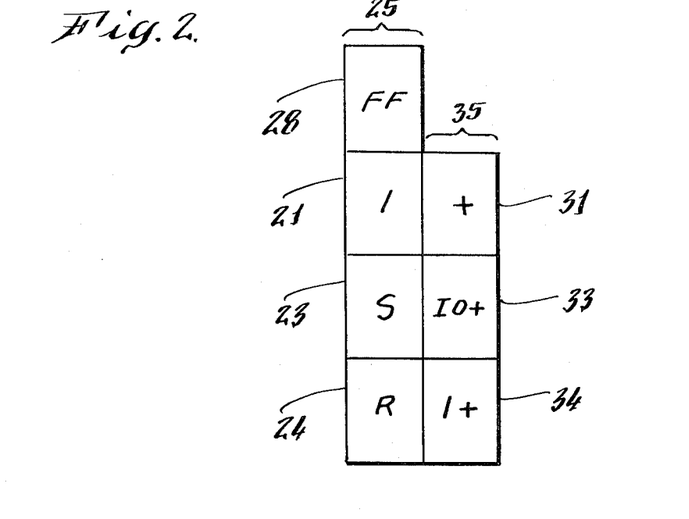
FIGS. 2 and 7 are operation programs illustrating the states of operating elements in the array of FIGS. 3, 5 and 8.

In the above functional description of the various types of logic cells, different blocks of FIG. 1 were used to represent different cells. The layout of these cells as described, is shown in FIG. 2. FIG. 2 represents the standard storage logic array program notation which is used by those skilled in the art. As shown in FIG. 2, two columns 25 and 35 are provided. Within column 25 is a storage cell 28 containing a flip-flop. Logic cell 21 contains a "1" type cell. Logic cell 23 contains an "S" type cell. Logic cell 24 contains an "R" type cell. Within column 35 are three logic cells 31, 33, and 34 containing "+", "IO+", and "1+" cells respectively. Throughout the remainder of the present description, column 25 will be referred to as a "data column" and column 35 will be referred to as an "OR" (or "+") column. Preferred embodiments of the electronic circuitry which can be used to implement the storage logic array program shown in FIG. 2 will be described in conjunction with FIGS. 3–6.

Figure 3:
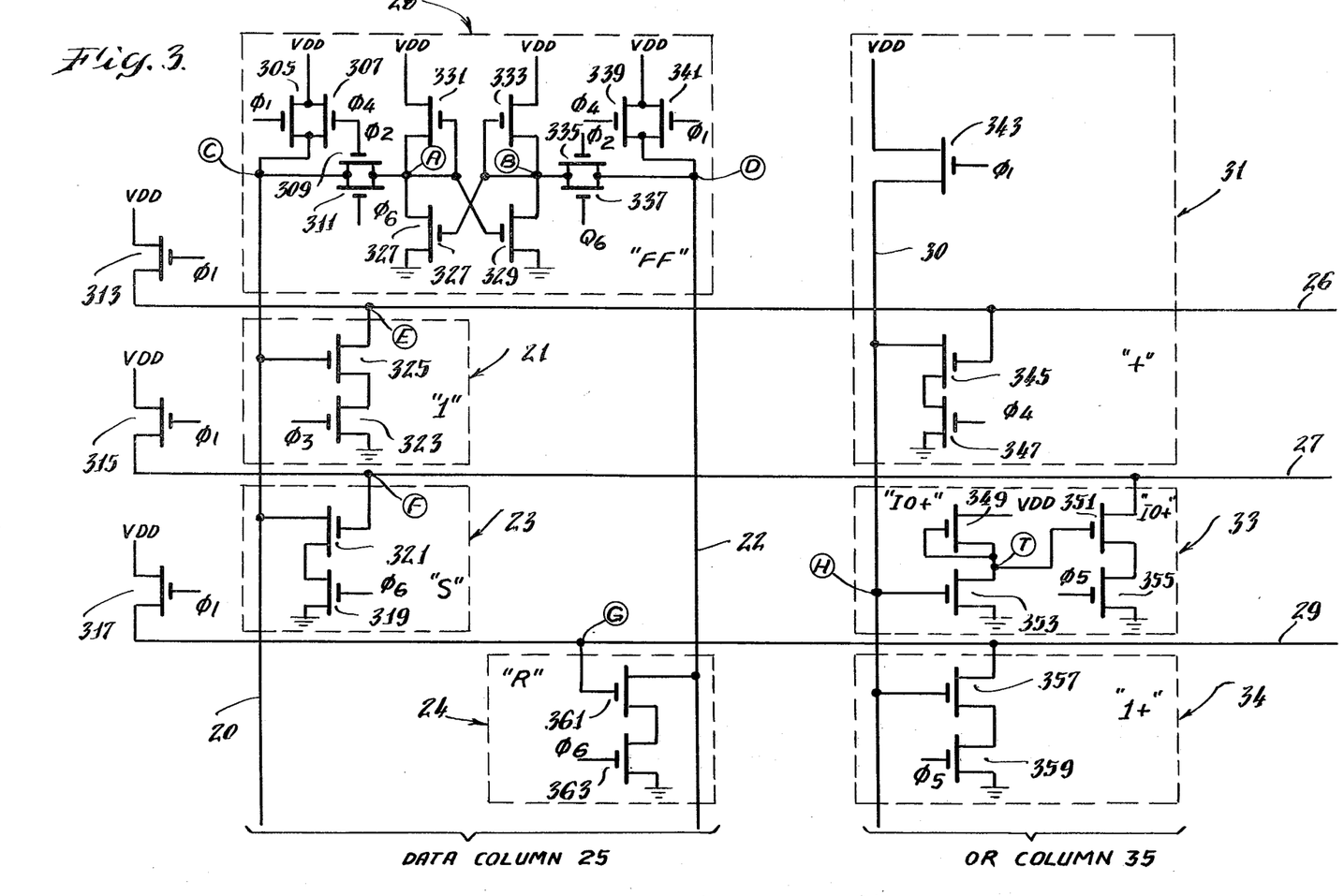
FIGS. 3, 5 and 8 are detailed illustrations of storage logic arrays.

FIG. 3 is an electronic circuit schematic of a six-phase two-wire dynamic storage logic array that executes the program of FIG. 2. The circuit can be constructed from silicon gate n-channel metal-oxide-semiconductor field effect transistors of the type which are used in integrated circuits. The various storage logic array cells used in the circuit of FIG. 3 are shown within dotted lines.

Storage cell 28 contains a flip-flop which uses a pair of cross-coupled static inverters composed of transistors 331, 333, 327 and 329. Transistors 331 and 333 are depletion type devices. Transistors 309 and 335 are used to switch the output of the static flip-flop to data column conductors 20 and 22 respectively when the flip-flop is being read. Transistors 311 and 337 are used to connect the data column conductors 20 and 22 respectively to the flip-flop when data is being written into the flip-flop. Transistor 305 is used to precharge data column conductor 20 prior to the time at which data is read out of the flip-flop at Node A by transistor 309. Similarly, transistor 341 is used to precharge data column conductor 22 just before data is read out of the flip-flop at Node B through transistor 335.

Transistors 307 and 339 are used to precharge data column conductors 20 and 22 respectively prior to writing data into the flip-flop at Node A through transistor 311 and at Node B through transistor 337. Data column conductors 20 and 22 are precharged to a voltage level VDD which is applied to transistors 305, 307, 339 and 341.

Row conductors 26, 27 and 29 are precharged to voltage level VVD minus a threshold value, through transistors 313, 315 and 317 respectively. The precharging of the rows occurs at the same time the columns are precharged prior to data being read from the flip-flop.

The "+" cell 31 of FIG. 3 contains a transistor 343 which is used to precharge the "+" ("OR") column. Also in the "+" cell are transistors 345 and 347, which are used to detect the state of the row they are connected to (row 26) and either discharge the "+" column or leave it charged depending on the binary state of row 26. For the circuit configuration shown in FIG. 3, a high signal on row conductor 26 will cause "+" column 30 to go low. The specific operation of this circuit will be described in more detail below.

Transistors 323 and 325 in the "1" cell detect the state of the flip-flop in memory cell 28 via data column conductor 20 and, depending on the binary state of data column conductor 20, discharge row conductor 26 or leave it charged.

The "S" cell and "R" cell comprise transistor pairs 319, 321 and 361, 363 respectively. These transistors detect the state of their corresponding row (row 27 for the "S" cell; row 29 for the "R" cell) and set or reset the flip-flop in storage cell 28 by driving the respective data column 20 or 22 low.

The "1+" cell uses transistors 357 and 359 to detect the condition of the "+" column 30 and discharge row 29 or leave it charged depending on the state of the "+" column 30. The "IO+" cell, as shown in FIG. 3, contains a static inverter constructed from transistors 349 and 353. The static inverter inverts the data on the "+" column 30 and drives transistor 351. Transistors 351, 355 detect the condition of the inverted "+" column at Node I and drive row 27 accordingly. Thus, if the "+" column 30 is high, Node I will be low, and row 27 will remain charged. If, on the other hand, the "+" column 30 is low, Node I will be high and row 27 will be discharged.

All of the above-described logic cells and row and column precharge transistors are operated in a dynamic mode by a 6-phase clock. The transistors of FIG. 3 which have their gates connected to a clock signal are indicated by the notations $\phi1$, $\phi2$, $\phi3$, $\phi4$, $\phi5$ or $\phi6$ according to the particular clock period which actuates them.

In accordance with the present invention, only two conductors 20 and 22 are provided in data column 25. These two column conductors are time-shared to provide a data path from the flip-flop in storage cell 28 via conductors 20 and 22 to the rows, and from the rows back up data column conductors 20, 22 to the flip-flop. As already indicated, data enters and exits from the flip-flop at complementary input/output ports designated by Nodes A and B. The "OR" column of FIG. 3 contains only a single conductor 30, the data on which is inverted in the "IO+" cell from Node H to Node I.

Figure 4:
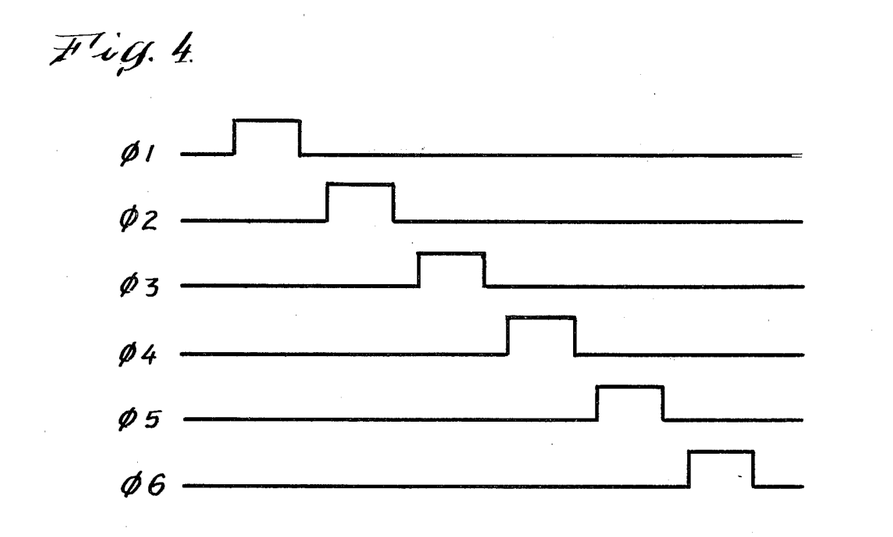
FIGS. 4, 6 and 9 are timing diagrams pertaining to the circuitry of FIGS. 3, 5 and 8.

FIG. 4 shows the 6 clock phases which are required for operation of the circuit of FIG. 3. In FIG. 4, each of the 6 clock phases is of the same time duration and none of the phases overlap.

The dynamic operation of the circuit in association with each clock period will now be described in detail. During $\phi1$, each of rows 26, 27 and 29 is precharged to a predetermined voltage through transistors 313, 315 and 317 respectively. The precharge voltage will be equal to the power supply voltage, VDD, minus the threshold voltage of the corresponding transistor 313, 315 or 317. Also during $\phi1$, each of the column conductors is precharged. Data column conductor 20 is precharged through transistor 305. Data column conductor 22 is precharged at time $\phi1$ through transistor 341. The "+" column conductor 30 is precharged at time $\phi1$ through transistor 343.

During the $\phi2$ clock period, data is transferred from the flip-flop formed by transistors 331, 333, 327 and 329 to respective data column conductors 20 and 22 through transistors 309 and 335. Thus, data from Node A of the flip-flop will be transferred through transistor 309 to data column conductor 20 at Node C, while data from Node B of the flip-flop will be transferred through transistor 335 to data column conductor 22 at Node D. Since data is being transferred from the flip-flop to the data column conductors, the data transfer operation is known to those skilled in the art as a "read cycle".

Data can also be "written" into the flip-flop from data column conductor 20 at Node C to the flip-flop at Node A through transistor 311 during clock period $\phi6$. Similarly, data can be written into flip-flop Node B through transistor 337 from Node D of data column conductor 22 during clock period $\phi6$. It should be recognized that by using parallel transistor pairs 309, 311 and 335, 337 to effect both read and write operations with respect to the flip-flop, only two data column conductors 20, 22 are required. This represents a significant improvement over prior art embodiments which required a greater number of data column conductors, typically four.

During clock period $\phi3$, data on data column conductor 20 is "AND-ed" on row 26 due to the operation of transistors 323 and 325. The term "AND-ed" is a Boolean algebra expression used in the design of digital logic circuits to mean that the output of a circuit will be high only if all of its inputs are high. As can be seen from FIG. 3, during clock period $\phi3$ transistor 323 will turn on. Thus, if data column conductor 20 is high, which will turn on transistor 325, row 26 will be forced to ground and thereby discharge into a low binary state. Those skilled in the art will appreciate that other logic cells which respond to particular clock periods, such as clock period $\phi3$, can be placed throughout a storage logic array in accordance with particular Boolean functions that the array is designed to perform.

In the circuit of FIG. 3, data column conductors 20 and 22 are precharged a second time during clock period $\phi4$. The second precharge insures that the flip-flop is not set to an improper state during the subsequent $\phi6$ time period. Since the only way a flip-flop can be set or reset is to pull either Node A or Node B to ground, the step of precharging data column conductors 20 and 22 during clock period $\phi4$ will prevent the flip-flop from improperly changing state due to the normal discharge that occurs over time on these column conductors. Also during $\phi4$, transistors 345 and 347 act to transfer data from row 26 to "+" column 30.

During clock period $\phi5$, data is transferred from the "+" column to row 27 by transistors 349, 353, 351 and 355 of the "IO+" cell 33. Data at Node I represents the inverted state of data at Node H. Thus, the "IO+" cell transfers the inverted state of the "+" column conductor 30 to row 27 during time period $\phi5$. Transistors 357 and 359 of the "1+" cell transfer data from the "+" column conductor 30 to row 29 during $\phi5$.

It can be seen that rows will be discharged during the $\phi3$ clock period due to "1" cell 21, and during the $\phi5$ clock period due to "1+" cell 34 and/or "IO+" cell 33. A "0" cell (not shown) could also be fabricated by interconnecting a "1" cell such as cell 21 to data column conductor 22 instead of data column conductor 20 as shown. Accordingly, the row data, after the $\phi5$ clock period, is the logical "AND" of all "1", "0", "1+", and "IO+" conditions specified on the particular row. In addition, the data on data column conductors 20 and 22 represents the logical "OR" of all of the "S" and "R" conditions specified in the particular column at the end of the $\phi6$ clock period.

During the $\phi6$ clock period, the flip-flop in memory cell 28 is reset by either of data column conductors 20 or 22 via transistors 311 or 337. The flip-flop will be set if an "S" cell (e.g. 23) has activated data column conductor 20. The flip-flop will be reset if an "R" cell (e.g. 24) has activated data column conductor 22.

The above described embodiment of the invention concerned a 6-phase clock implementation of a dynamic storage logic array having a pair of time-shared data column conductors. Another embodiment of the invention makes use of a 4-phase clock, again utilizing a pair of time-shared data column conductors. This implementation is shown in FIG. 5 with its corresponding clock waveforms shown in FIG. 6.

Figure 5:
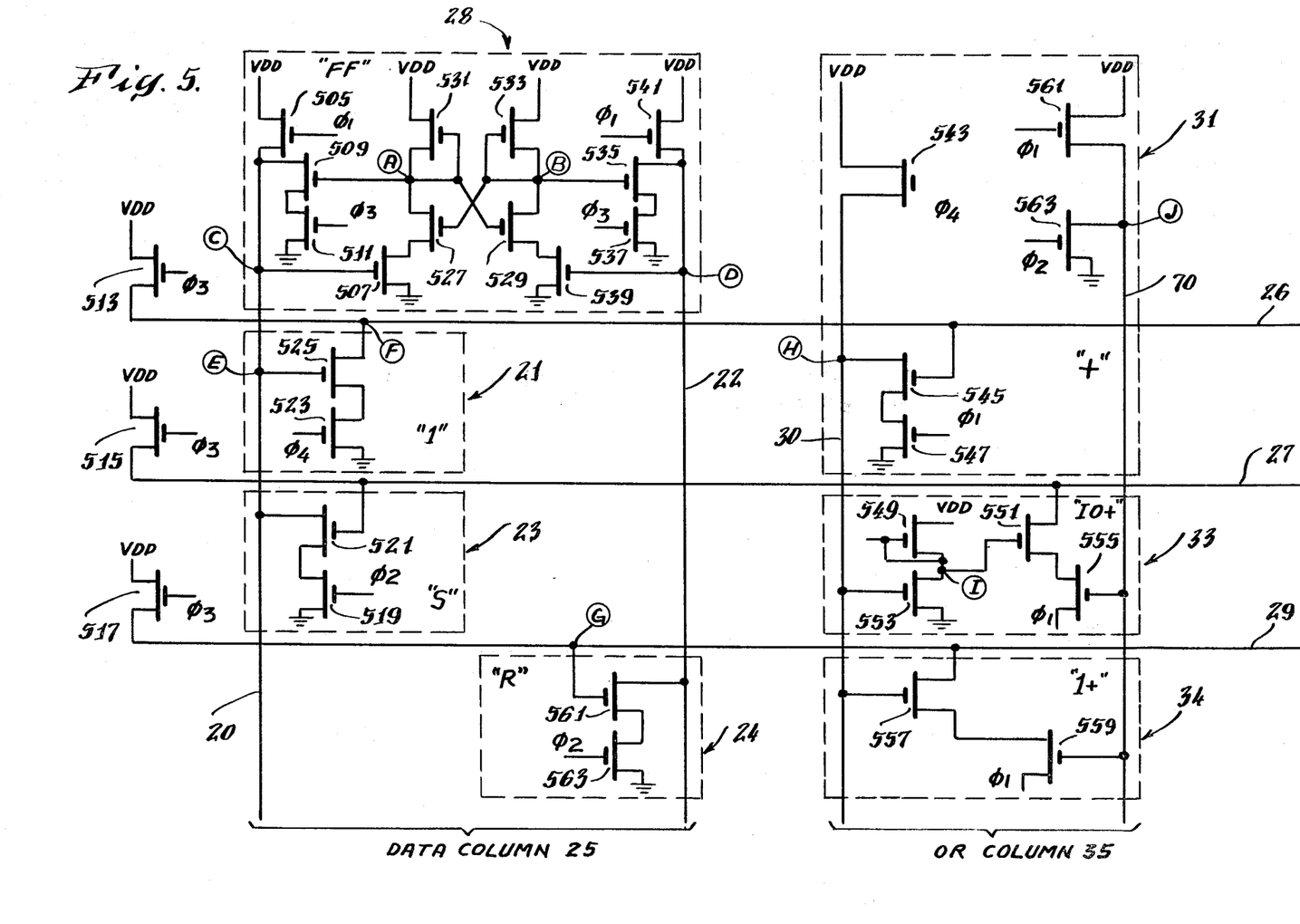
Figure 6:
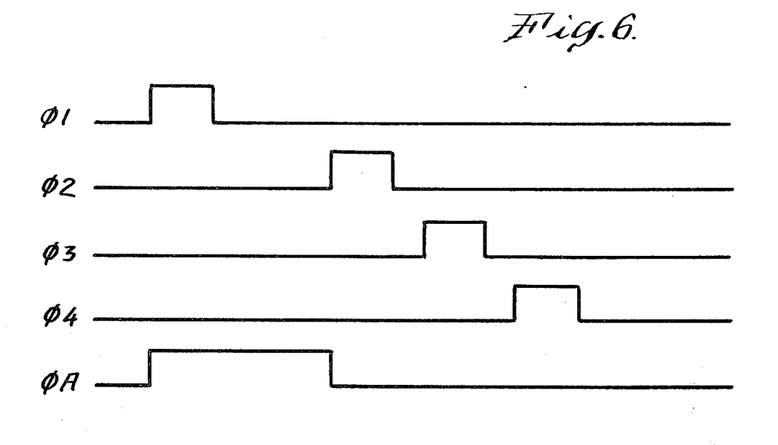

As shown in FIG. 5, memory cell 28 contains a flip-flop comprising transistors 527, 529, 531 and 533. Transistors 531 and 533 are depletion type devices. Node A of the flip-flop is coupled to data column conductor 20. Node B is coupled to data column conductor 22. The state of the flip-flop is read during clock period $\phi3$. In reading data out of Node A onto data column conductor 20, transistors 509 and 511 are used. In reading data from Node B onto data column conductor 22, transistors 535 and 537 are used. Writing data into the flip-flop from data column conductors 20 and 22 does not occur in response to any particular clock period. Rather, data is written into the flip-flop when either column 20 or 22 is pulled low. When data column conductor 20 is pulled low, for example, transistor 507 is turned off. Thus, the drain of transistor 527 is no longer held to ground potential by transistor 507. This causes Node A to go high, setting the flip-flop. Alternatively, if data column conductor 22 goes low, transistor 539 will turn off causing Node B of the flip-flop to go high, resetting the flip-flop. An advantage of this arrangement over the embodiment shown in FIG. 3 is that only a single precharge is required for the data column conductors 20 and 22. Thus, the number of phases required to be generated by the clock is reduced by one. A second clock phase is saved by locally creating a fifth clock phase in an empty time slot between $\phi1$ and $\phi2$. The additional clock phase is shown in FIG. 6 as $\phi A$.

φA is generated for every independent "+" column by transistors 561 and 563. The source and drain of transistor 561 are connected between the power supply (VDD) and φA column 70. During clock period φ1, transistor 561 is turned on, causing φA column 70 to go high. Transistor 563 has its source and drain connected between φA column 70 and ground. During clock period φ2, transistor 563 turns on and pulls φA column 70 low. Thus, clock period φA commences with clock period φ1 and ends at the beginning of clock period φ2.

In the circuit embodiment of FIG. 5, data column conductors 20 and 22 are precharged by transistors 505 and 541 respectively in response to clock period φ1. When data column conductors 20 and 22 are precharged, Nodes C and D go high turning on transistors 507 and 539 respectively. These transistors, when turned on, hold the flip-flop in a static state.

Row data, which was set during a previous φ4 clock period, can be transferred to the "+" column 30 during φ1 by transistors 545 and 547. As shown in FIG. 5, these transistors define a logic cell which takes data from row conductor 26 and causes Node H of the "+" column 30 to assume a binary state in accordance therewith. In addition, data on the "+" column 30 is inverted by transistors 549 and 553 so that Node I stores the inverse of the data on Node H of the "+" column. Since Node I is lightly loaded, the inverted data from "+" column 30 can be presented to "IO+" cell 33 during the same time (φ1) that the "+" column 30 data is presented to the "1+" cell 34. The data on the "+" column 30 and the inverted data on Node I, is transferred to row conductors 29 and 27 respectively when φA is high and φ1 is low. This transfer is produced by transistors 551 and 555 for the "IO+" cell 33 and by transistors 557 and 559 for the "1+" cell 34. The rows become true during this same time slot (the time when φA is high and φ1 is low) because any action on a row conductor due to a "1" or a "0" cell in the data column has already taken place during the previous φ4 clock period and the action of the "1+" and "O+" cells under the "OR" column takes place during the present time slot.

During clock period φ2, data from row conductors is driven up the data column conductors 20, 22 by transistors 519 and 521 for the "S" cell 23 and transistors 561 and 563 for the "R" cell 24. Both data column conductors 20 and 22 (Nodes C and D) are precharged to a high state during φ1. Thus, if no action is taken by any "S" or "R" cell in a data column, the data column conductors are left high and the flip-flop does not change state. If some action is taken by any "S" or "R" cell, the appropriate column is pulled low, and transistor 507 or 539 switches off causing the flip-flop to change state.

Following the φ2 clock period, the φ3 clock causes the rows to be precharged through transistors 513, 515 and 517 respectively. Simultaneously, during φ3, data is transferred from the flip-flop in memory cell 28 to data column conductors 20 and 22 by transistors 509, 511 for data column conductor 20 and 535, 537 for data column conductor 22.

During the φ4 clock period, data is transferred from data column conductors 20 and 22 to rows interconnected therewith by "1" or "0" logic cells. For the "1" cell 21 shown in FIG. 5, transistors 532 and 525 serve to transfer data from column conductor 20 to row 26 during clock period φ4.

Figure 7:
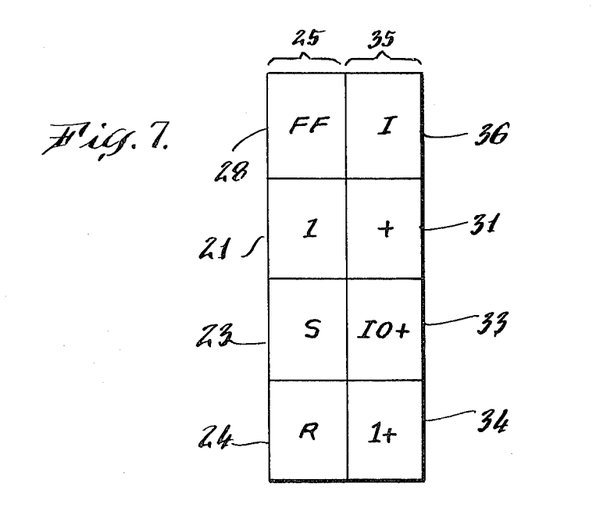
Figure 8:
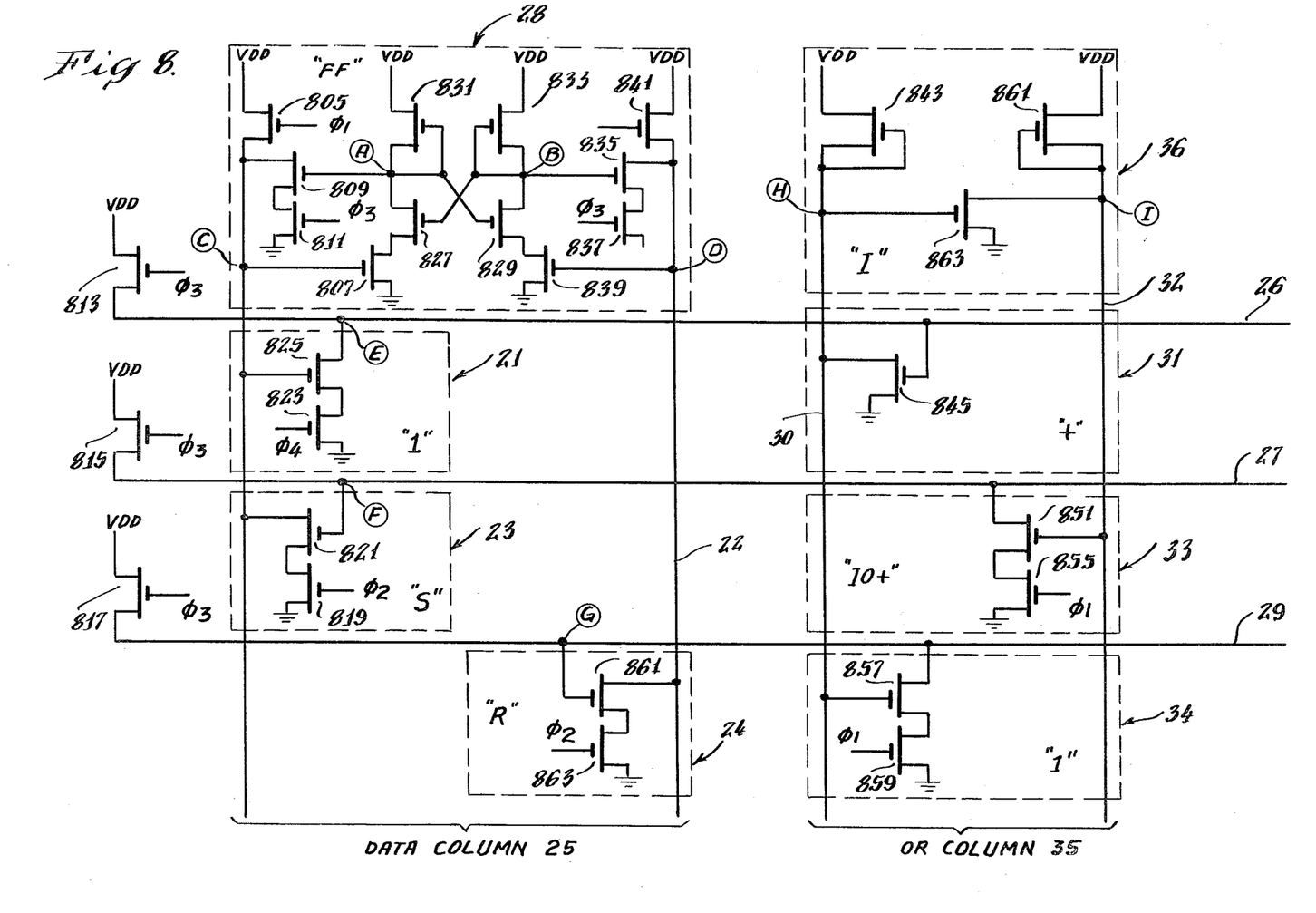
Figure 9:
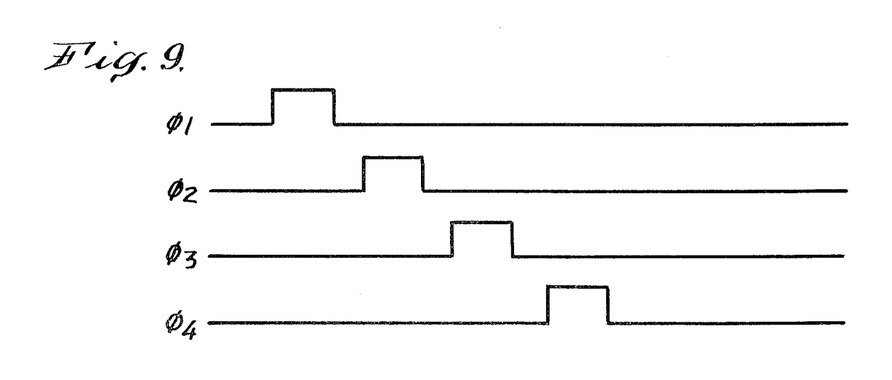

Another four-phase implementation of the two conductor data column storage logic array is described in conjunction with FIGS. 7–9. FIG. 7 shows the storage logic array program which has been implemented in the circuit of FIG. 8. This program is the same as that shown in FIG. 2 with the addition of an inverter cell in the "OR" column. The inverter, represented by transistor 863 in FIG. 8, is used to provide an additional column conductor 32 which is the inverse of the "+" column 30.

The four-phase dynamic-static storage logic array with two data column conductors shown in FIG. 8 uses the same static flip-flop cell that is used in the four-phase dynamic storage logic array circuit of FIG. 5. The circuit of FIG. 8 also uses an identical "1" cell 21, "S" cell 23 and "R" cell 24 as is used in the circuit implementation shown in FIG. 5. The "+" cell 31 of FIG. 8 comprises a single transistor 845 which takes the data from a row, in this case row 26, inverts it, and presents it on the "+" column 30.

As noted, the "+" column data is inverted in the "I" cell 36 which is composed of transistors 843, 861 and 863. The inverted "+" column data appears on the inverted "+" column conductor 32 at Node I. Since this "+" column action is static, the data from the "+" column conductor 30 and the inverted "+" column conductor 32 can be transferred to interconnected rows during clock period φ1 instead of during the time slot between the φ1 and φ2 clock periods as was done in the four-phase dynamic storage logic array circuit of FIG. 5.

FIG. 9 shows each of the four-phase clock waveforms used in the circuit of FIG. 8. The circuit embodiment of FIG. 8 operates in a similar manner to the embodiment shown in FIG. 5. The difference between these two circuits is that the locally generated clock phase, φA, required in the circuit of FIG. 5 is not required in the circuit of FIG. 8. The circuit of FIG. 8 does require, however, that the "+" column conductor 30 and the inverted "+" column conductor 32 be driven by static pull-up transistors 843 and 861 respectively. In the embodiment of FIG. 5, dynamic pull-up transistors 543 and 561 were used to precharge the "OR" column conductors. In the static embodiment of FIG. 8, Nodes H and I are heavily loaded. Thus, a significant amount of power will be required to drive these nodes as compared to the corresponding nodes in the dynamic circuitry of FIG. 5.

The advantage of the circuit shown in FIG. 8 over that shown in FIG. 5 is that the clocking scheme in the former is simpler. In FIG. 8, the clocking is a conventional four-phase scheme whereas in FIG. 5, the four-phase dynamic circuit was actually a five-phase scheme, the fifth phase being generated locally. A further advantage of the static-dynamic storage logic array circuit of FIG. 8 is the simpler construction of the "IO+" cell 33. As shown in FIG. 8, logic cell 33 is composed of only two transistors 851 and 855. The "IO+" cell 33 shown in FIG. 5, however, requires four transistors, 549, 551, 553 and 555.

While several embodiments of the present invention have been disclosed for purposes herein, it is to be understood that many variations and modifications could be made thereto. It is intended to cover all of these variations and modifications which fall within the scope of the present invention as defined by the appended claims.

We claim:

1. An integrated circuit storage logic array comprising:

at least one data column having first and second data column conductors;

a plurality of rows disposed substantially orthogonal to said column, each row comprising a row conductor;

clock means for generating a plurality of phase-displaced clock signals;

a storage cell operatively associated with said data column, said storage cell having a memory element, output means responsive to said clock means for transferring data from said memory element to said first and second data column conductors, and input means coupled for transferring data from said first and second data column conductors to said memory element; and a plurality of functionally distinct logic cells connected between selected column and row conductors and adapted to be actuated by said clock means to manipulate data among said selected column and row conductors.

2. The storage logic array of claim 1 further comprising at least one OR column having an OR column conductor.

3. The storage logic array of claim 2 wherein said memory element is a flip-flop.

4. The storage logic array of claim 3 further comprising means for precharging said column and row conductors to a predetermined level in response to a first of said clock signals.

5. The storage logic array of claim 4 wherein said flip-flop includes a pair of complementary input/output ports, one of said ports being coupled to said first data column conductor and the other of said ports being couupled to the second data column conductor.

6. The storage logic array of claim 5 wherein said output means is coupled to said clock means and data from respective input/output ports of said flip-flop is switched by said output means to said first and second data column conductors in response to a second of said clock signals.

7. The storage logic array of claim 6 wherein said clock means generates six phase-displaced clock signals.

8. The storage logic array of claim 7 wherein at least one of said logic cells is connected to cause a row conductor to assume a binary state determined by the binary state of a data column conductor in response to the third of said clock signals.

9. The storage logic array of claim 7 wherein at least one of said logic cells is connected to cause said OR column conductor to assume a binary state determined by the binary state of a row conductor in response to the fourth of said clock signals.

10. The storage logic array of claim 7 including means for precharging said data column conductors a second time to a predetermined level in response to the fourth of said clock signals.

11. The storage logic array of claim 9 including means for precharging said data column conductors a second time to a predetermined level in response to the fourth of said clock signals.

12. The storage logic array of claim 7 or 10 wherein at least one of said logic cells is connected to cause a row conductor to assume a binary state determined by the binary state of said OR column conductor in response to the fifth of said clock signals.

13. The storage logic array of claim 7 or 10 wherein at least one of said logic cells is connected to cause a data column conductor to assume a binary state determined by the binary state of a row conductor in response to the sixth of said clock signals.

14. The storage logic array of claim 13 wherein said input means is coupled to said clock means and data from said first and second data column conductors is switched to corresponding input/output ports of said flip-flop by said input means in response to the sixth of said clock signals.

15. The storage logic array of claim 8 wherein said logic cell comprises a plurality of transistors adapted to transfer to said row conductor the same binary state that is on said data column conductor.

16. The storage logic array of claim 8 wherein said logic cell comprises a plurality of transistors adapted to transfer to said row conductor the opposite binary state of that which is on said data column conductor.

17. The storage logic array of claim 12 wherein said logic cell comprises a plurality of transistors adapted to transfer to said row conductor the same binary state that is on said OR column conductor.

18. The storage logic array of claim 12 wherein said logic cell comprises a plurality of transistors adapted to transfer to said row conductor the opposite binary state of that which is on said OR column conductor.

19. The storage logic array of claim 9 wherein said logic cell comprises a plurality of transistors adapted to transfer to said OR column conductor the same binary state that is on said row conductor.

20. The storage logic array of claim 9 wherein said logic cell comprises a plurality of transistors adapted to transfer to said OR column conductor the opposite binary state of that which is on said row conductor.

21. The storage logic array of claim 13 wherein said logic cell comprises a plurality of transistors adapted to transfer to said data column conductor the same binary state that is on said row conductor.

22. The storage logic array of claim 13 wherein said logic cell comprises a plurality of transistors adapted to transfer to said data column conductor the opposite binary state of that which is on said row conductor.

23. An integrated circuit storage logic array comprising:

at least one data column having first and second data column conductors;

at least one OR column having an OR column conductor;

a plurality of rows disposed substantially orthogonal to said columns, each row comprising a row conductor;

a storage cell operatively associated with said data column and having a memory element with a pair of complementary input/output ports, each of said ports being coupled to a respective one of said data column conductors;

clock means for generating six phase-displaced clock signals;

means for precharging said column and row conductors to a predetermined level in response to the first of said clock signals;

output means associated with said input/output ports for switching data from said ports to respective data column conductors in response to the second of said clock signals;

a first logic cell connected to cause a row conductor to assume a binary state determined by the binary state of a data column conductor in response to the third of said clock signals;

a second logic cell connected to cause an OR column conductor to assume a binary state determined by the binary state of a row conductor in response to the fourth of said clock signals;

a third logic cell connected to cause a row conductor to assume a binary state determined by the binary state of an OR column conductor in response to the fifth of said clock signals; and a fourth logic cell connected to cause one of said data column conductors to assume a binary state determined by the binary state of a row conductor in response to the sixth of said clock signals.

24. The storage logic array of claim 23 further comprising input means associated with said input/output ports for switching data from said first and second data column conductors to corresponding ports in response to the sixth of said clock signals.

25. The storage logic array of claim 23 or 24 including means for precharging said data column conductors a second time to a predetermined level in response to the fourth of said clock signals.

26. An integrated circuit storage logic array comprising:

at least one data column having first and second data column conductors;

a plurality of rows disposed substantially orthognal to said column, each row comprising a row conductor;

clock means for generating four phase-displaced clock periods;

a storage cell operatively associated with said data column, said storage cell having a flip-flop memory element, output means responsive to said clock means for transferring data from said memory element to said first and second data column conductors, and input means coupled for transferring data from said first and second data column conductors to said memory element;

a plurality of logic cells connected between selected column and row conductors; and at least one OR column having an OR column conductor.

27. The storage logic array of claim 26 further comprising means for precharging said data column conductors to a predetermined level during the first of said clock periods and wherein at least one of said logic cells is connected to cause an OR column conductor to assume a binary state determined by the binary state of a row conductor during said first clock period.

28. The storage logic array of claim 27 further comprising means for generating an additional clock period which begins when the first clock period begins and ends when the second clock period begins.

29. The storage logic array of claim 28 wherein another of said logic cells is connected to cause a row conductor to assume a binary state determined by the binary state of an OR column conductor after said first clock period and during said additional clock period.

30. The storage logic array of claim 29 wherein another of said logic cells is connected to cause a particular one of said data column conductors to assume a binary state determined by the binary state of a row conductor during the second of said clock periods.

31. The storage logic array of claim 30 wherein said input means of said storage cell changes the state of said flip-flop in response to a predetermined binary state being assumed by said particular data column conductor.

32. The storage logic array of claim 31 further comprising means for precharging said row conductors to a predetermined level during the third of said clock periods and wherein said output means of said storage cell switches data from said flip-flop to said data column conductors during said third clock period.

33. The storage logic array of claim 32 wherein another of said logic cells is connected to cause a row conductor to assume a binary state determined by the binary state of a data column conductor during the fourth of said clock periods.

34. The storage logic array of claim 33 further comprising means for precharging said OR column conductor to a predetermined level during said fourth clock period.

35. The storage logic array of claim 26 or 34 wherein said logic cells each comprise a plurality of transistors.

36. The storage logic array of claim 26 wherein said OR column further comprises an inverted OR column conductor.

37. The storage logic array of claim 36 wherein one of said logic cells is connected to invert data from a row conductor and transfer the inverted data to an OR column conductor.

38. The storage logic array of claim 36 further comprising means for precharging said data column conductors to a predetermined level during the first of said clock periods and wherein one of said logic cells is connected to cause a row conductor to assume a binary state determined by the binary state of an OR column conductor during said first clock period.

39. The storage logic array of claim 38 wherein another of said logic cells is connected to cause a particular one of said data column conductors to assume a binary state determined by the binary state of a row conductor during the second of said clock periods.

40. The storage logic array of claim 39 wherein said input means of said storage cell changes the state of said flip-flop in response to a predetermined binary state being assumed by said particular data column conductor.

41. The storage logic array of claim 40 further comprising means for precharging said row conductors to a predetermined level during the third of said clock periods and wherein said output means of said storage cell switches data from said flip-flop to said data column conductors during said third clock period.

42. The storage logic array of claim 41 wherein another of said logic cells is connected to cause a row conductor to assume a binary state determined by the binary state of a data column conductor during the fourth of said clock periods.

43. The storage logic array of claim 36 or 42 wherein said OR column conductor and inverted OR column conductor each has a static pull-up transistor coupled thereto.

44. The storage logic array of claim 42 wherein said logic cells each comprise a plurality of transistors.

* * * * *